(12) United States Patent
Matsubara

(10) Patent No.: US 7,164,149 B2
(45) Date of Patent: Jan. 16, 2007

(54) SEMICONDUCTOR DEVICE, SEMICONDUCTOR DEVICE MANUFACTURING METHOD, AND SEMICONDUCTOR DEVICE TEST METHOD

(75) Inventor: Yoshinori Matsubara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/632,822

(22) Filed: Aug. 4, 2003

(65) Prior Publication Data
US 2004/0207057 A1 Oct. 21, 2004

(30) Foreign Application Priority Data
Apr. 18, 2003 (JP) .............................. 2003-114568

(51) Int. Cl.
*H01L 29/10* (2006.01)
*H01L 23/58* (2006.01)

(52) U.S. Cl. ........................................ 257/48; 257/724

(58) Field of Classification Search ................ 257/777, 257/723, 724, 48, 786, 780
See application file for complete search history.

(56) References Cited

U.S. PATENT DOCUMENTS

| | | | |
|---|---|---|---|
| 4,246,595 A * | 1/1981 | Noyori et al. ............... | 257/668 |
| 5,321,277 A | 6/1994 | Sparks et al. | |
| 5,353,498 A * | 10/1994 | Fillion et al. .................. | 29/840 |
| 5,923,048 A | 7/1999 | Inoue | |
| 5,959,462 A * | 9/1999 | Lum ........................... | 324/765 |
| 6,064,219 A * | 5/2000 | Aigner ........................ | 324/763 |
| 6,538,264 B1 * | 3/2003 | Corbett et al. ................ | 257/48 |
| 6,825,553 B1 * | 11/2004 | Chua et al. ................... | 257/691 |
| 6,836,025 B1 * | 12/2004 | Fujisawa et al. ............. | 257/782 |
| 6,921,975 B1 * | 7/2005 | Leal et al. .................... | 257/723 |

FOREIGN PATENT DOCUMENTS

| | | |
|---|---|---|
| JP | 2002-118229 | 4/2002 |
| JP | 2002-168917 | 6/2002 |

* cited by examiner

*Primary Examiner*—S. V. Clark
(74) *Attorney, Agent, or Firm*—Oblon, Spivak, McClelland, Maier & Neustadt, P.C.

(57) ABSTRACT

A semiconductor device includes a first layer, a plurality of first test elements which are arranged in the first layer, a second layer which is different from the first layer and has a first surface and a second surface opposed to the first surface, the first surface of the second layer being adhered to the first layer, an opening portion which is arranged on the second surface of the second layer, and a plurality of pads which are arranged in the second layer and are electrically connected to the first test elements, a part of the pads being exposed from the opening portion.

4 Claims, 9 Drawing Sheets

SEMICONDUCTOR DEVICE, SEMICONDUCTOR DEVICE MANUFACTURING METHOD, AND SEMICONDUCTOR DEVICE TEST METHOD

CROSS-REFERENCE TO RELATED APPLICATIONS

This application is based upon and claims the benefit of priority from the prior Japanese Patent Application No. 2003-114568, filed Apr. 18, 2003, the entire contents of which are incorporated herein by reference.

BACKGROUND OF THE INVENTION

1. Field of the Invention

The present invention relates to a semiconductor device having a TEG (Test Element Group), a semiconductor device manufacturing method, and a semiconductor device test method.

2. Description of the Related Art

A TEG (Test Element Group) chip obtained by forming the building components (interconnection, transistor, capacitor, resistor, and the like) of a semiconductor device on a chip has conventionally been used to facilitate the reliability evaluation of the semiconductor device or the like.

In a conventional TEG chip 10, as shown in FIGS. 13 and 14, a test site (test area) portion 20 and probe pad portion 30 are formed on one silicon substrate 70.

The test site portion 20 is a region where a test element 22 such as a transistor or capacitor exists. The probe pad portion 30 is a region where a probe pad for arranging a probe exists.

In the conventional TEG chip 10, one TEG 11 is constituted by, e.g., the test site portion 20 of three test elements 22 and 16 probe pads 37. More specifically, the three test elements 22 are arranged at the center of the TEG 11, and eight probe pads 37 are arranged on each of two sides along the test elements 22. Each probe pad 37 is electrically connected to the test element 22 via interconnections and contacts in insulating films 71, 72, 73, 74, 75, and 76.

In this situation, the integration degree of semiconductor integrated circuits is increasing year by year. Semiconductor devices to be evaluated at the test site have been downsized. However, probe pads for electrically evaluating a test site are still large despite such reduction in the feature size of semiconductor devices.

For example, in the 0.11-μm generation, the probe pad size is 80 μm□ to 100 μm□, and the test site is laid out in almost the same area as the area occupied by the probe pad. Hence, the measurement probe pad occupies 60% of the TEG chip at maximum in the TEG layout. Note that the probe pad means one arranged for only a probe.

In the prior art, it is difficult to reduce the probe pad area because the probe pad cannot be shared between a plurality of test elements and the test site is evaluated by a common probe card.

As described above, in the prior art, the area occupied by the probe pad in the TEG chip is large, and it is difficult to reduce the probe pad area. The region where the test site can be formed is small, and the test site region is limited by the probe pad area.

BRIEF SUMMARY OF THE INVENTION

According to the first aspect of the present invention, there is provided a semiconductor device comprising a first layer, a plurality of first test elements which are arranged in the first layer, a second layer which is adhered to the first layer and is different from the first layer, and a plurality of pads which are arranged in the second layer and electrically connected to the first test elements.

According to the second aspect of the present invention, there is provided a semiconductor device manufacturing method comprising forming a first layer and a second layer being different from the first layer, the first layer having a plurality of first test elements, the second layer having a plurality of pads, and adhering the first and second layers to electrically connect the first test elements to the pads.

According to the third aspect of the present invention, there is provided a semiconductor device test method comprising forming a first layer and a second layer being different from the first layer, the first layer having a plurality of first test elements, the second layer having a plurality of pads, adhering the first and second layers to electrically connect at least some of the test elements to the pads, and evaluating performance of the at least some of the test elements.

DETAILED DESCRIPTION OF THE INVENTION

Figure 1A:
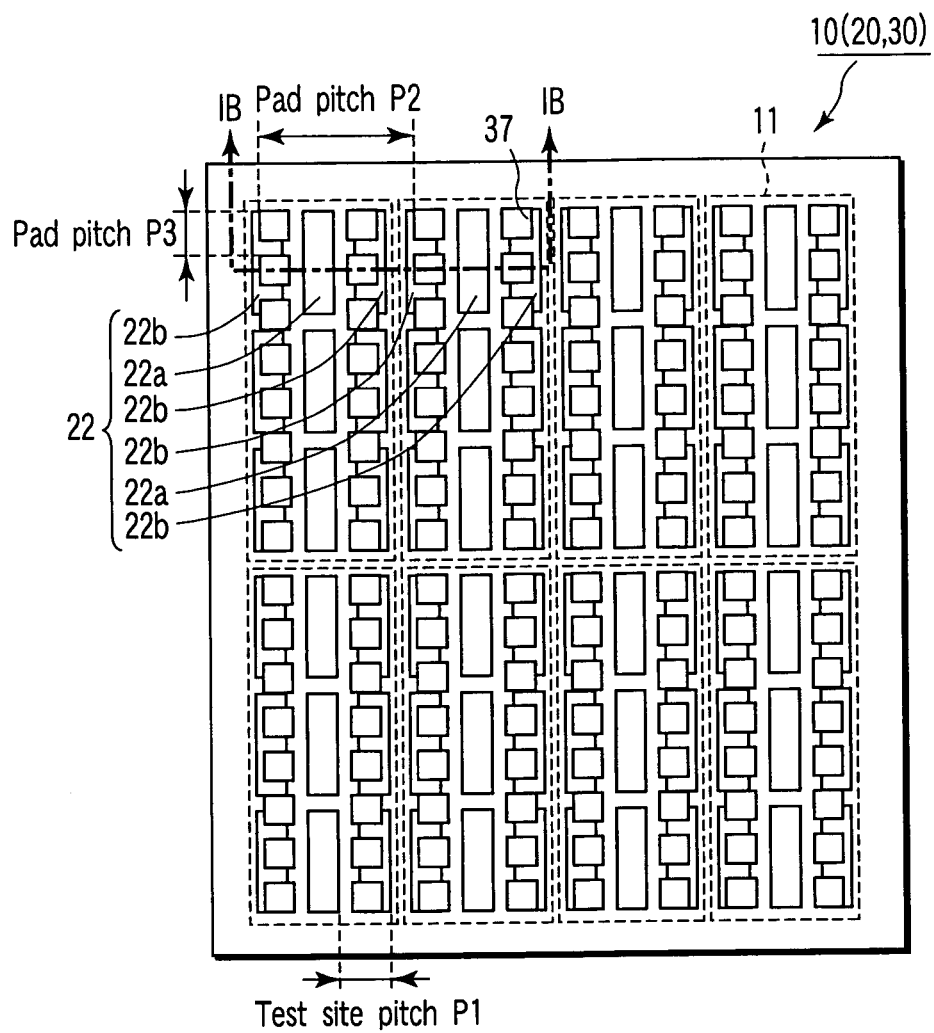
FIG. 1A is a plan view showing a TEG chip according to the first embodiment of the present invention.

Preferred embodiments of the present invention will be described below with reference to the several views of the accompanying drawing. In the following description, the same reference numerals denote the same parts throughout all the views.

[First Embodiment]

In the first embodiment, a TEG (Test Element Group) chip is constituted by a test site portion and probe pad portion. The TEG chip is formed by adhering the test site portion and probe pad portion.

A TEG chip according to the first embodiment of the present invention will be described with reference to FIGS. 1A and 1B.

Figure 1B:
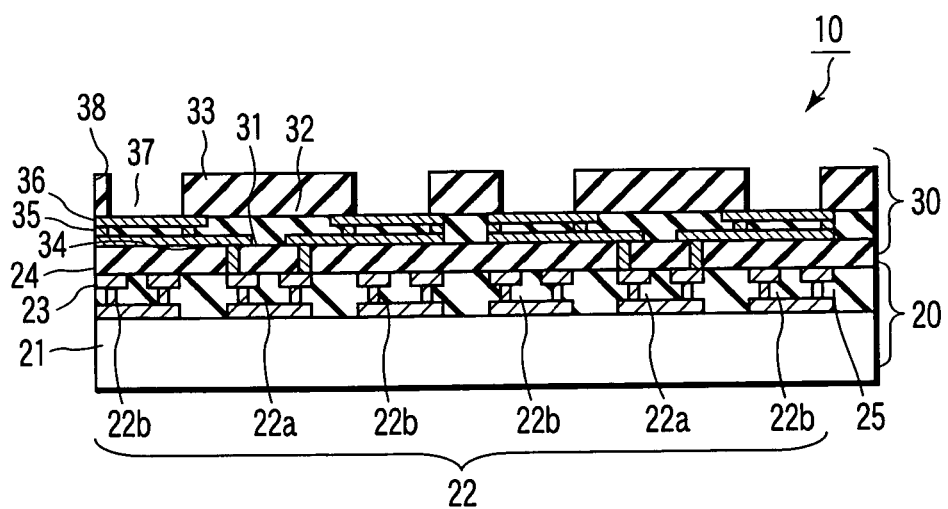
FIG. 1B is a sectional view showing the TEG chip taken along the line IB—IB in FIG. 1A.

As shown in FIGS. 1A and 1B, a TEG chip 10 according to the first embodiment is constituted by separately forming a test site (test area) portion 20 and probe pad portion 30 and adhering them into one structure. The test site portion 20 is a region where test elements 22 exist. The probe pad portion 30 is a region where probe pads 37 for arranging a probe exist.

One TEG 11 of the TEG chip 10 is constituted by, e.g., the test site portion 20 of three test elements 22 and 16 probe pads 37. More specifically, the three test elements 22 are arranged at the center of the TEG 11, and eight probe pads 37 are arranged on each of two sides along the test elements 22. Each probe pad 37 is electrically connected to a test element 22a via interconnections 24 and 35 and contacts 23, 34, and 36 in insulating films 25, 31, and 32.

The test elements 22 at the test site portion 20 are classified into elements 22a which are electrically connected to the probe pads 37, and elements 22b which are not electrically connected to the probe pads 37. In the first embodiment, unlike the prior art, the test elements 22b which are not electrically connected to the probe pads 37 exist on a silicon substrate 21 below the probe pads 37. A portion where each test element 22 overlaps a corresponding probe pad 37 exists in the plan view of the TEG chip 10.

The test site portion according to the first embodiment of the present invention will be described with reference to FIGS. 2A and 2B.

Figure 2A:
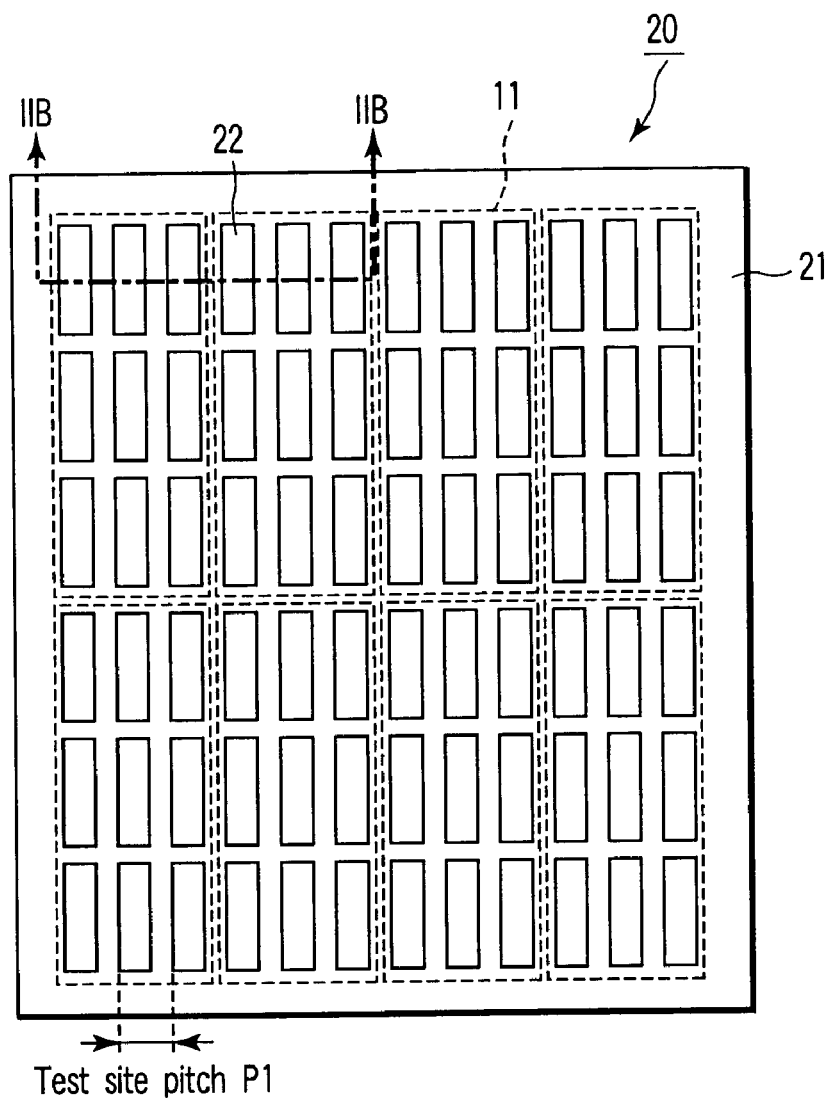
FIG. 2A is a plan view showing a test site portion according to the first embodiment of the present invention.
Figure 2B:
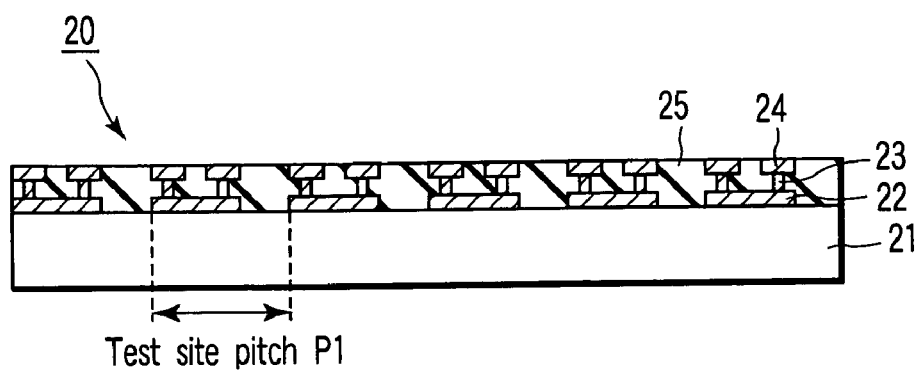
FIG. 2B is a sectional view showing the test site portion taken along the line IIB—IIB in FIG. 2A.

As shown in FIGS. 2A and 2B, the test elements 22 are formed on the entire surface of the silicon substrate 21 at the test site portion 20 according to the first embodiment. Each contact 23 which is connected to a corresponding test element 22 is formed in the insulating film 25. The interconnection (pad) 24 which is connected to the contact 23 is formed. The upper surface of the interconnection 24 is exposed outside the insulating film 25, and serves as a connection portion for electrically connecting the probe pad portion 30.

A plurality of test elements 22 at the test site portion 20 are arranged on the whole TEG chip 10 at a predetermined interval (test site pitch P1). The test site pitch P1 is set using, as a reference, a pad set which is a standard in each device generation.

Examples of the test element 22 are a memory element such as an SRAM, DRAM, FeRAM, or MRAM, a capacitor, a resistor, and an interconnection.

The surface shape of the test element 22 may be a rectangular, as shown in FIG. 2A, or can be changed to various shapes such as a square and circle.

The probe pad portion according to the first embodiment of the present invention will be described with reference to FIGS. 3A and 3B.

Figure 3A:
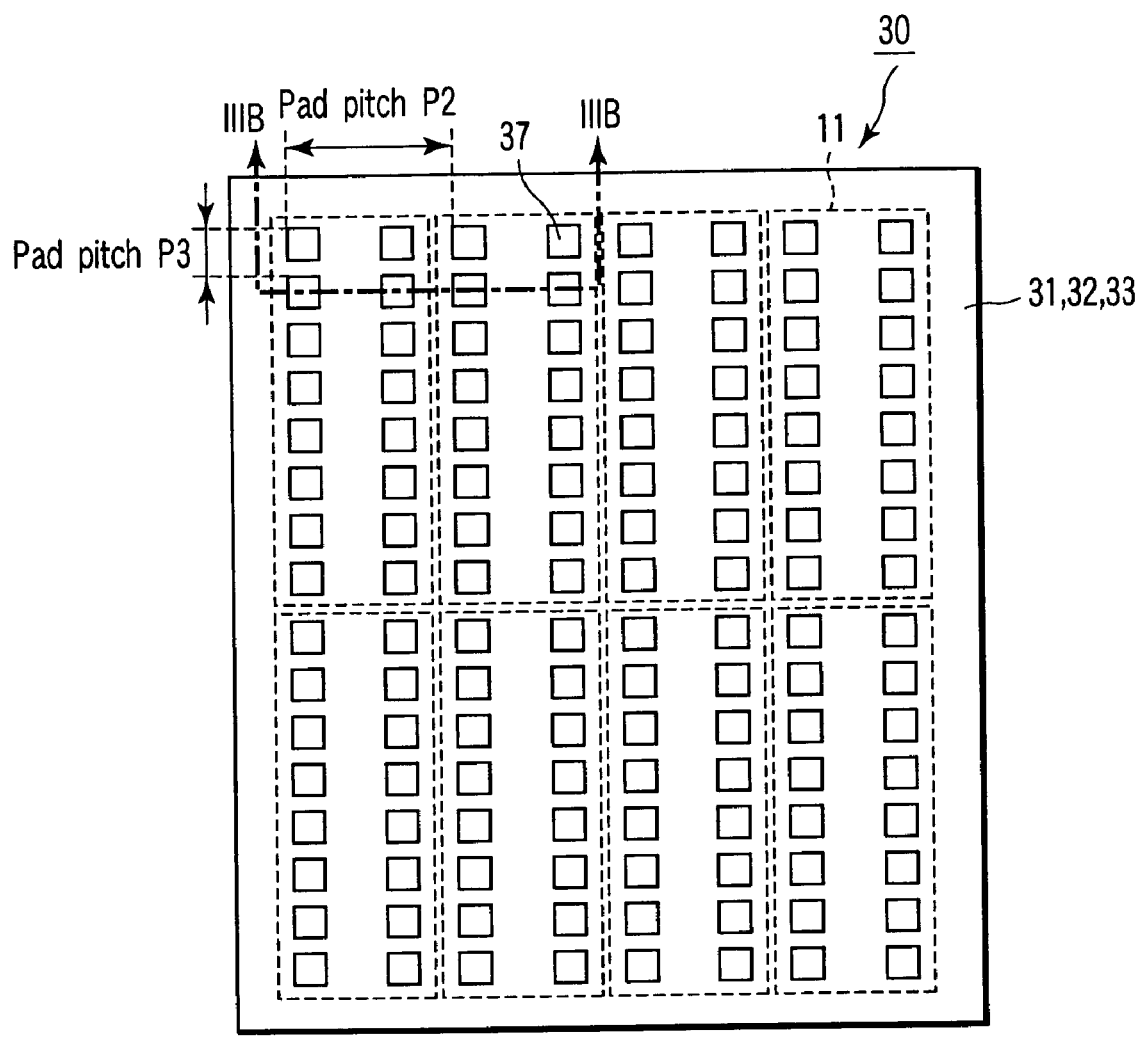
FIG. 3A is a plan view showing a probe pad portion according to the first embodiment of the present invention.
Figure 3B:
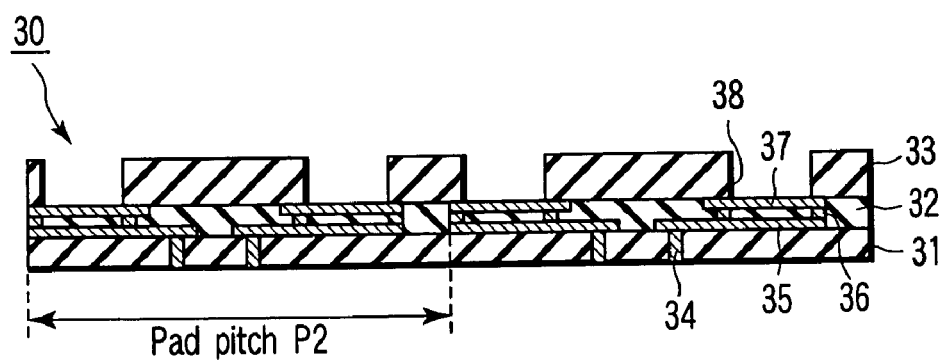
FIG. 3B is a sectional view showing the probe pad portion taken along the line IIIB—IIIB in FIG. 3A.

As shown in FIGS. 3A and 3B, the probe pad portion 30 according to the first embodiment is comprised of the probe pads 37 and multilayer interconnections. More specifically, each contact 34, interconnection 36, and probe pad 37 are formed in the insulating films 31 and 32. An insulating film (passivation film) 33 having openings 38 is so formed as to expose part of the upper surface of each probe pad 37. The lower surface of the contact 34 is exposed outside the insulating film 31, and serves as a connection portion for electrically connecting the test site portion 20.

A plurality of probe pads 37 at the probe pad portion 30 are arranged on the entire TEG chip 10 at a predetermined interval (pad pitch P2) in the row direction (lateral direction on the sheet surface) and a predetermined interval (pad P3) in the column direction (longitudinal direction on the sheet surface). The pad pitch P2 in the row direction is set using, as a reference, a pad set which is a standard in each device generation. The pad pitch P3 in the column direction is set using the minimum pitch of the probe pin as a reference.

A TEG chip manufacturing method according to the first embodiment of the present invention will be explained.

A test site portion 20 and probe pad portion 30 are separately formed.

The test site portion 20 is formed, e.g., as follows. A test element 22 such as an SRAM or DRAM is formed on a silicon substrate 21, and the test element 22 is buried in an insulating film 25. An opening is formed in the insulating film 25, and filled with a metal film to form a contact 23. An interconnection 24 is formed from a metal film on the contact 23.

The probe pad portion 30 is formed, e.g., as follows. An opening is formed in an insulating film 31, and filled with a metal film to form a contact 34. An interconnection 35 is formed and connected to the contact 34. An insulating film 32 is so formed as to bury the interconnection 35. An opening is formed in the insulating film 32, and filled with a metal film to form a contact 36. A probe pad 37 is formed and connected to the contact 36. An insulating film 33 is formed on the probe pad 37, and then an opening 38 is formed in the insulating film 33. Part of the upper surface of the probe pad 37 is exposed outside.

After the test site portion 20 and probe pad portion 30 are separately formed, they are adhered to each other.

More specifically, the upper surface of the silicon substrate 21 at the test site portion 20 and the lower surface of the probe pad 37 at the probe pad portion 30 are positioned to face each other. The test site portion 20 and probe pad portion 30 are so adhered as to bring the interconnection 24 of the test site portion 20 and the contact 34 of the probe pad portion 30 into contact with each other. As a result, part of the test element 22 is electrically connected to the probe pad 37 to complete the TEG chip 10.

A TEG chip test method according to the first embodiment of the present invention will be explained.

The test site portion 20 and probe pad portion 30 are separately formed.

The test site portion 20 and probe pad portion 30 are adhered to each other, and part of the test element 22 and the probe pad 37 are electrically connected to each other.

A probe is brought into contact with the probe pad 37 of the probe pad portion 30 to evaluate the performance of the test element 22.

Although a plurality of test elements 22 are formed at the test site portion 20, test elements 22 to be evaluated in this test method are only ones which are electrically connected to the probe pads 37. In FIG. 1B, the test elements 22a which are electrically connected to the probe pads 37 can be tested and evaluated. The test elements 22b which are not electrically connected to the probe pads 37 cannot be tested and evaluated.

In the first embodiment, of a plurality of test elements 22 formed on the TEG chip 10, only test elements 22 to be tested and evaluated can be selected, tested, and evaluated. For example, objects to be evaluated can be selected, tested, and evaluated by the following method.

Figure 4:
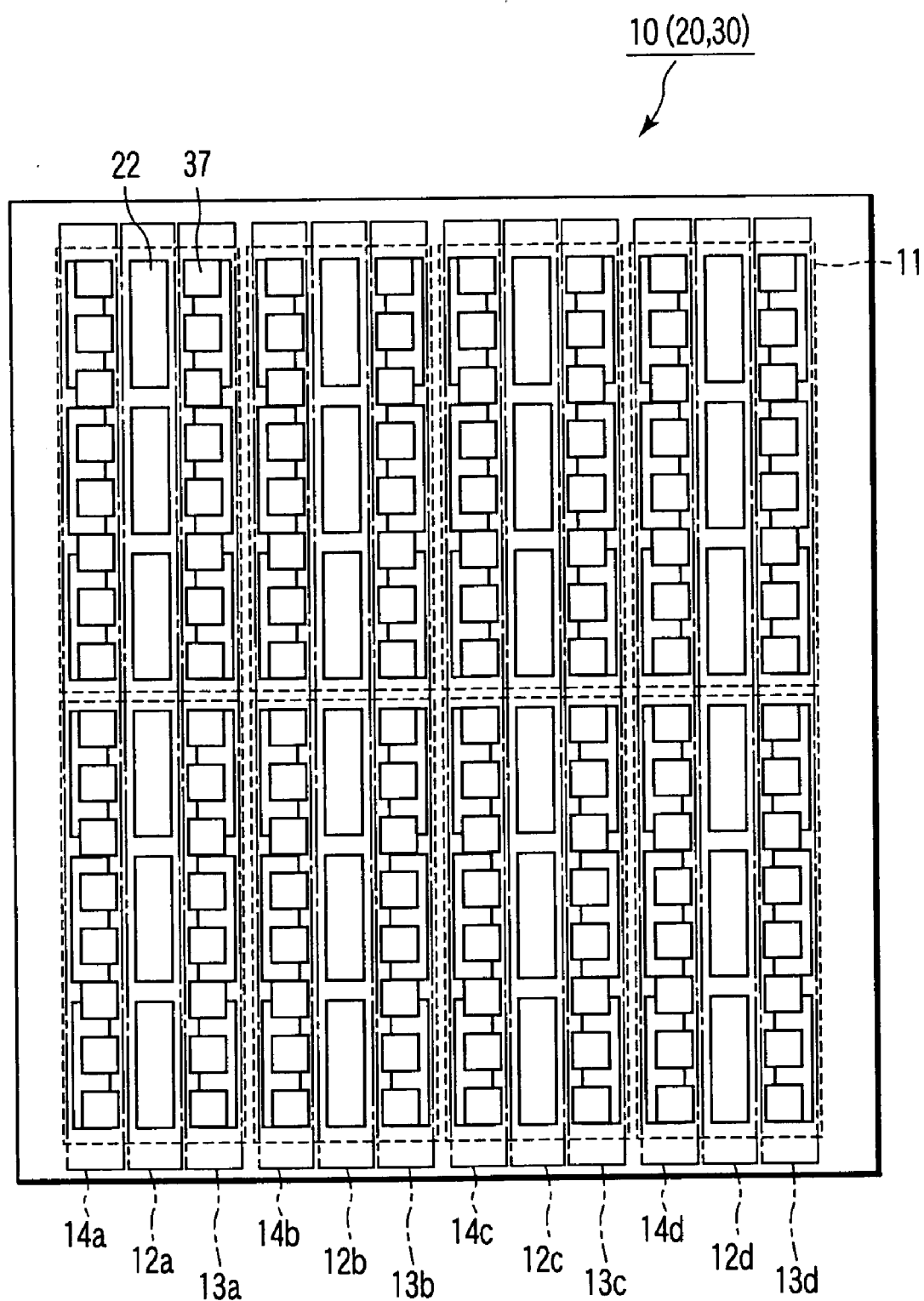
FIG. 4 is a plan view showing the TEG chip according to the first embodiment of the present invention.

As shown in FIG. 4, a plurality of test elements 22 are classified by the element type. Test elements 22 of the same type are so aligned as to arrange test elements of different types in respective columns.

For example, test elements 22 formed from SRAMs are arranged in first groups 12a, 12b, 12c, and 12d. Test elements 22 formed from DRAMS are arranged in second groups 13a, 13b, 13c, and 13d. Test elements 22 formed from MRAMs are arranged in third groups 14a, 14b, 14c, and 14d.

In this example, when the test site portion 20 and probe pad portion 30 are adhered, as shown in FIG. 4, only the test elements 22 formed from SRAMs in the first groups 12a, 12b, 12c, and 12d can be evaluated.

When the probe pad portion 30 in FIG. 4 is shifted right on the sheet surface, and the test elements 22 in the second groups 13a, 13b, 13c, and 13d are electrically connected to the probe pads 37, only the test elements 22 formed from DRAMs in the second groups 13a, 13b, 13c, and 13d can be evaluated. Similarly, when the probe pad portion 30 in FIG. 4 is shifted left on the sheet surface, and the test elements 22 in the third groups 14a, 14b, 14c, and 14d are electrically connected to the probe pads 37, only the test elements 22 formed from MRAMs in the third groups 14a, 14b, 14c, and 14d can be evaluated.

According to the first embodiment, the test site portion 20 and probe pad portion 30 are separately formed and adhered. The test element 22 can be formed on the silicon substrate 21 regardless of the area occupied by the probe pad 37. The region of the test element 22 is, therefore, free from any limitations by the area of the probe pad 37. This yields the following effects.

The test elements 22 are arranged at the pitch P1' in the prior art, but can be arranged at a pitch P1 of P1'/N in the first embodiment. The first embodiment, therefore, allows arranging N times of the number of conventional test elements 22 at maximum on the entire surface of the silicon substrate 21.

Figure 5A:
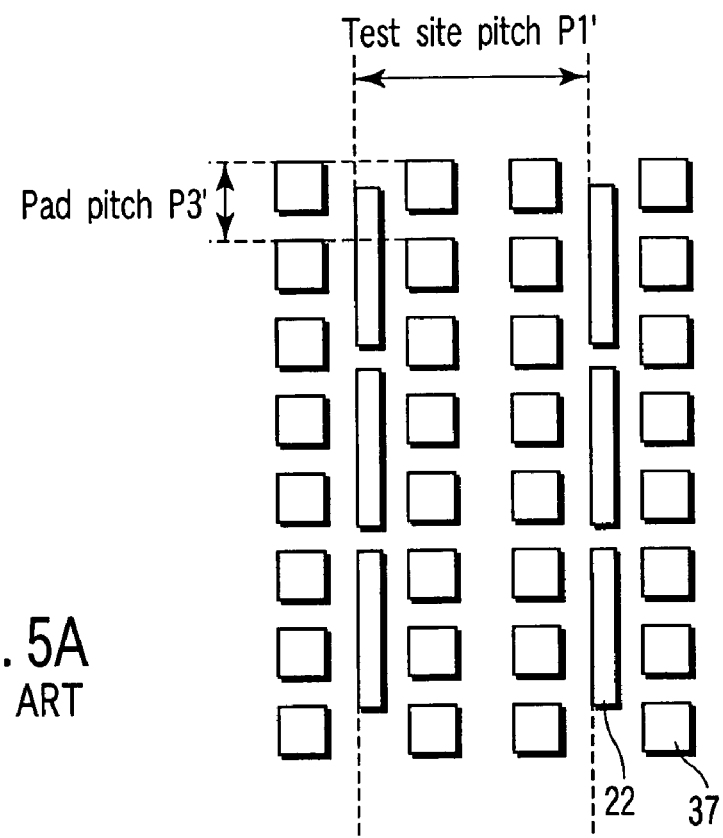
FIG. 5A is a plan view showing a conventional TEG chip.
Figure 5B:
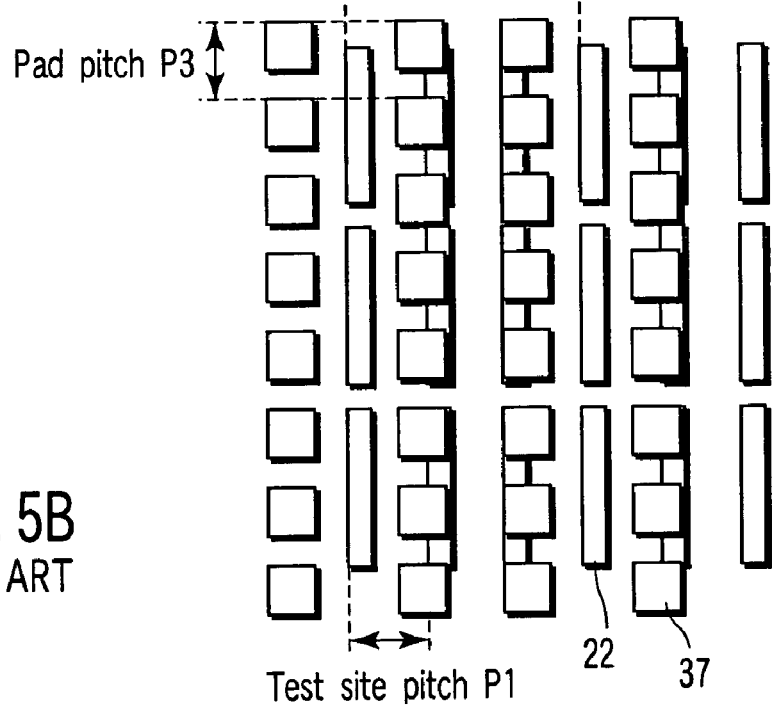
FIG. 5B is a plan view showing the TEG chip according to the first embodiment of the present invention.

For example, when the test elements 22 are arranged at the pitch P1' in the prior art (see FIG. 5A), the test elements 22 can be arranged in the first embodiment at the pitch P1 which is ⅓ the pitch P1' (see FIG. 5B). In this case, three times of the number of conventional test elements 22 can be arranged on the entire surface of the silicon substrate 21.

Since the number of test elements 22 can be increased, the number of types of test elements 22 to be evaluated can be increased. This is very effective because many test elements of different types can be arranged on a system LSI on which various devices are formed on a single substrate.

According to the first embodiment, the test elements 22 are classified by the type, and test elements 22 of the same type are aligned. The adhering portions of the test site portion 20 and probe pad portion 30 can be adjusted to select elements to be evaluated out of a plurality of test elements 22.

[Second Embodiment]

The second embodiment adopts an area bump. A TEG chip is constituted by a test site portion, interconnection portion, and chip carrier portion. The TEG chip is formed by adhering the test site portion, interconnection portion, and chip carrier portion.

In the second embodiment, the same reference numerals as in the first embodiment denote the same parts, and a description thereof will be omitted or simplified. Different parts will be mainly described.

A TEG chip according to the second embodiment of the present invention will be described with reference to FIGS. 6A and 6B. A solder ball is not illustrated in FIG. 6A.

Figure 6A:
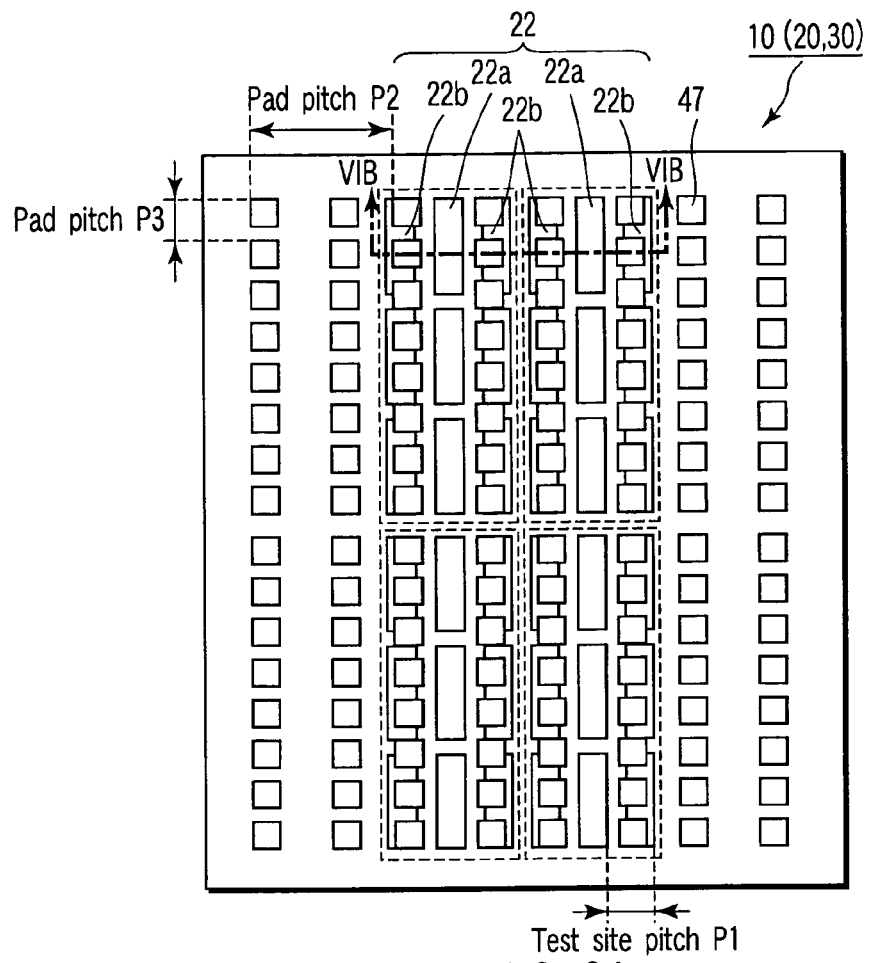
FIG. 6A is a plan view showing a TEG chip according to the second embodiment of the present invention.
Figure 6B:
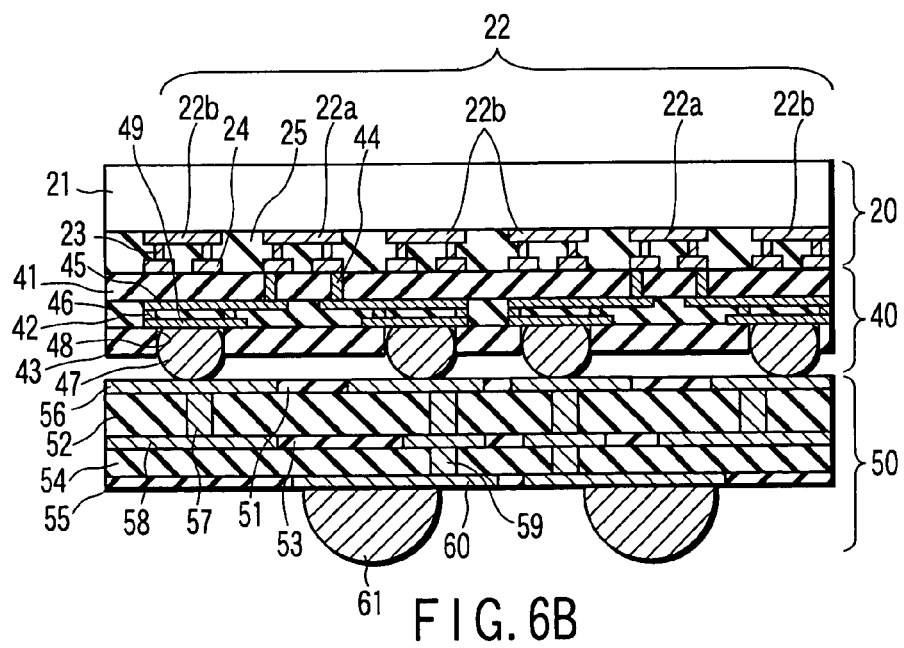
FIG. 6B is a sectional view showing the TEG chip taken along the line VIB—VIB in FIG. 6A.

As shown in FIGS. 6A and 6B, a TEG chip 10 according to the second embodiment is constituted by separately forming a test site portion 20, interconnection portion 40, and chip carrier portion 50 and adhering them into one structure.

A plurality of test elements 22 at the test site portion 20 are arranged at a high density on a silicon substrate 21. The test elements 22 are classified into elements 22a which are electrically connected to solder balls 61 via interconnections 24, 45, 49, 56, 58, and 60, contacts 23, 44, 46, 57, and 59, and bumps 47, and elements 22b which are not electrically connected to the solder balls 61. In the second embodiment, the test elements 22b which are not electrically connected to the solder balls 61 exist on the silicon substrate 21 below the bumps 47. A portion where each test element 22 overlaps a corresponding bump 47 exists in the plan view of the TEG chip 10.

Figure 7:
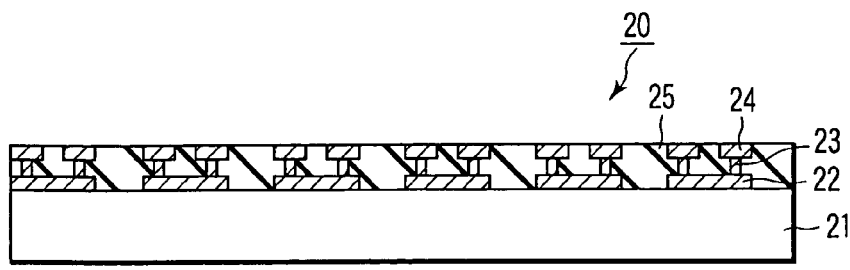
FIG. 7 is a sectional view showing a test site portion according to the second embodiment of the present invention.

FIG. 7 shows the test site portion according to the second embodiment of the present invention. The structure is the same as that in the first embodiment, and a description thereof will be omitted.

The interconnection portion according to the second embodiment of the present invention will be explained with reference to FIG. 8.

Figure 8:
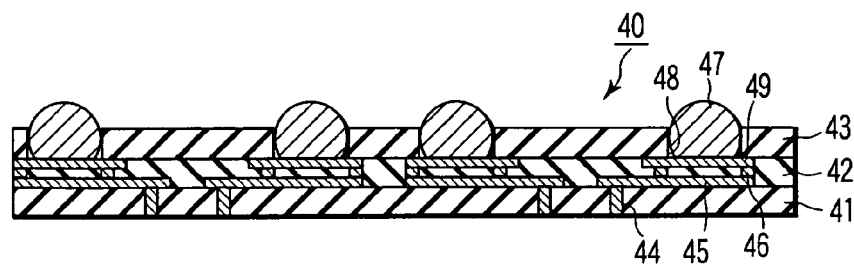
FIG. 8 is a sectional view showing an interconnection portion according to the second embodiment of the present invention.

As shown in FIG. 8, the interconnection portion 40 according to the second embodiment is comprised of the bumps 47 and multilayer interconnections. More specifically, the contacts 44 and 46 and the interconnections 45 and 49 are formed in insulating films 41 and 42. An insulating film 43 having openings 48 is so formed as to expose part of the upper surface of each interconnection (pad) 49. The bump 47 is formed on the exposed surface of the interconnection 49. The lower surface of the contact 44 is exposed outside the insulating film 41, and serves as a connection portion for electrically connecting the test site portion 20. The bump 47 serves as a connection portion for electrically connecting the chip carrier portion 50.

Pluralities of bumps 47 and interconnections 49 at the interconnection portion 40 are arranged on the entire TEG chip 10 at, e.g., a predetermined interval (pad pitch P2) in the row direction and a predetermined interval (pad pitch P3) in the column direction, similar to the first embodiment.

The chip carrier portion according to the second embodiment of the present invention will be explained with reference to FIG. 9.

Figure 9:
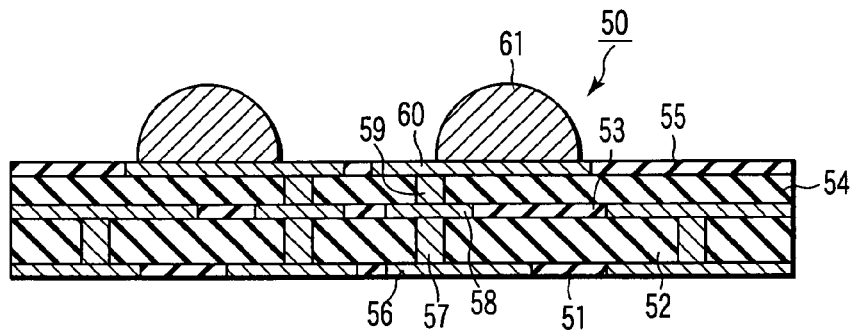
FIG. 9 is a sectional view showing a chip carrier portion according to the second embodiment of the present invention.

As shown in FIG. 9, the chip carrier portion 50 according to the second embodiment is constituted by the solder balls 61 and multilayer interconnections. More specifically, the contacts 57 and 59 and the interconnections 56, 58, and 60 are formed in insulating films 51, 52, 53, 54, and 55. The solder balls 61 are formed on the interconnection 60. The lower surface of the interconnection 56 is exposed outside the insulating film 51, and serves as a connection portion for electrically connecting the interconnection portion 40.

A TEG chip manufacturing method according to the second embodiment of the present invention will be explained.

A test site portion 20, interconnection portion 40, and chip carrier portion 50 are separately formed.

The test site portion 20 is formed by, e.g., the same method as that in the first embodiment.

The interconnection portion 40 is formed, e.g., as follows. An opening is formed in an insulating film 41, and filled with a metal film to form a contact 44. An interconnection 45 is formed and connected to the contact 44. An insulating film 42 is so formed as to bury the interconnection 45. An opening is formed in the insulating film 42, and filled with a metal film to form a contact 46 and interconnection 49. An insulating film 43 is formed on the interconnection 49, and then an opening 48 is formed in the insulating film 43. A bump 47 is formed in the opening 48.

The chip carrier portion 50 is formed, e.g., as follows. An interconnection 56 is formed in the insulating film 51, and an insulating film 52 is formed on the interconnection 56. An opening is formed in the insulating film 52, and filled with a metal film to form a contact 57. An interconnection 58 is formed and connected to the contact 57. An insulating film 53 is so formed as to bury the interconnection 58. An insulating film 54 is formed on the insulating film 53. An opening is formed in the insulating film 54, and filled with a metal film to form a contact 59. An interconnection 60 is formed and connected to the contact 59. An insulating film 55 is so formed as to bury the interconnection 60. A solder ball 61 is formed on the interconnection 60.

Figure 10A:
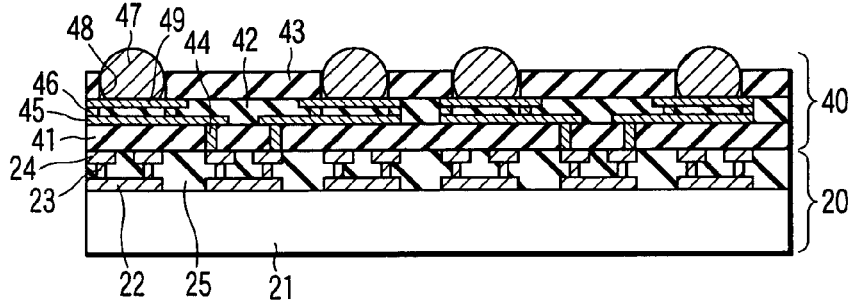
FIG. 10A is a sectional view showing a state in which the test site portion and interconnection portion according to the second embodiment of the present invention are adhered to each other.

After the test site portion 20, interconnection portion 40, and chip carrier portion 50 are separately formed, the test site portion 20 and interconnection portion 40 are adhered to each other, as shown in FIG. 10A.

More specifically, the upper surface of the silicon substrate 21 at the test site portion 20 and the lower surface of the bump 47 at the interconnection portion 40 are positioned to face each other. The test site portion 20 and interconnection portion 40 are so adhered as to bring the pad 24 of the test site portion 20 and the contact 44 of the interconnection portion 40 into contact with each other. As a result, part of the test element 22 is electrically connected to the bump 47.

Figure 10B:
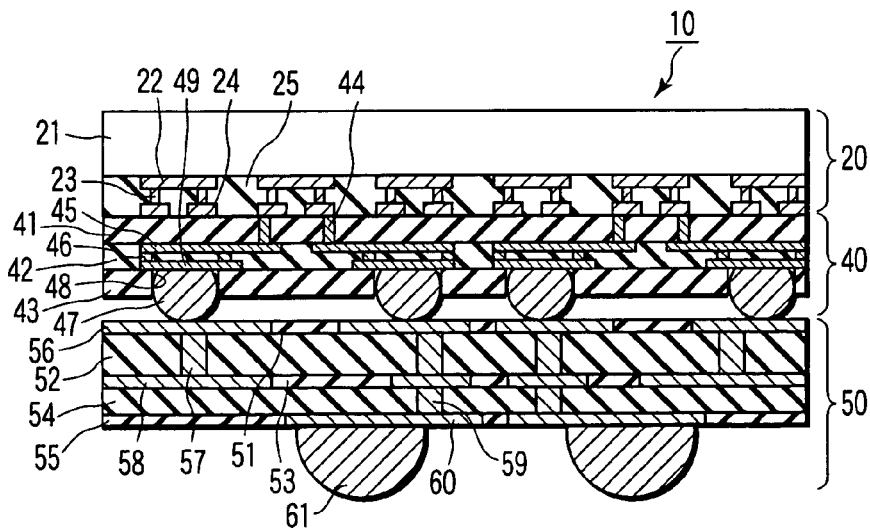
FIG. 10B is a sectional view showing a state in which the test site portion, interconnection portion, and chip carrier portion according to the second embodiment of the present invention are adhered to each other.

Thereafter, the test site portion 20, interconnection portion 40, and chip carrier portion 50 are adhered to each other, as shown in FIG. 10B.

More specifically, the upper surface of the bump 47 at the interconnection portion 40 and the lower surface of the solder ball 61 at the chip carrier portion 50 are positioned to face each other. The interconnection portion 40 and chip carrier portion 50 are so adhered as to bring the bump 47 of the interconnection portion 40 and the interconnection 56 of the chip carrier portion 50 into contact with each other, thereby completing the TEG chip 10.

A TEG chip test method according to the second embodiment of the present invention will be explained.

The test site portion 20, interconnection portion 40, and chip carrier portion 50 are separately formed.

The test site portion 20 and interconnection portion 40 are adhered to each other, and part of the test element 22 and the bump 47 are electrically connected to each other.

The test site portion 20, interconnection portion 40, and chip carrier portion 50 are adhered to each other. Part of the test element 22 and the solder ball 61 are electrically connected via the bump 47.

The performance of the test element 22 is evaluated using the solder ball 61.

Although a plurality of test elements 22 are formed at the test site portion 20, test elements 22 to be evaluated in this test method are only ones which are electrically connected to the solder ball 61. In FIG. 6B, the test elements 22a which are electrically connected to the solder balls 61 can be tested and evaluated. The test elements 22b which are not electrically connected to the solder balls 61 cannot be tested and evaluated.

In the second embodiment, similar to the first embodiment, of a plurality of test elements 22 formed on the TEG chip 10, only test elements 22 to be tested and evaluated can be selected, tested, and evaluated.

According to the second embodiment, the test site portion 20, interconnection portion 40, and chip carrier portion 50 are separately formed and adhered. The test element 22 can be formed on the silicon substrate 21 regardless of the area occupied by the interconnection (pad) 49. The region of the test element 22 is free from any limitations by the area of the interconnection 49.

Similar to the first embodiment, the test elements 22 are classified by the type, and test elements 22 of the same type are aligned. The adhering portions of the test site portion 20 and interconnection portion 40 can be adjusted to select elements to be evaluated out of a plurality of test elements 22.

The present invention is not limited to the above-described embodiment, and can be variously modified without departing from the spirit and scope of the invention in practical use.

For example, to evaluate heat resistance or the like, the TEG chip 10 may be packaged.

Figure 11:
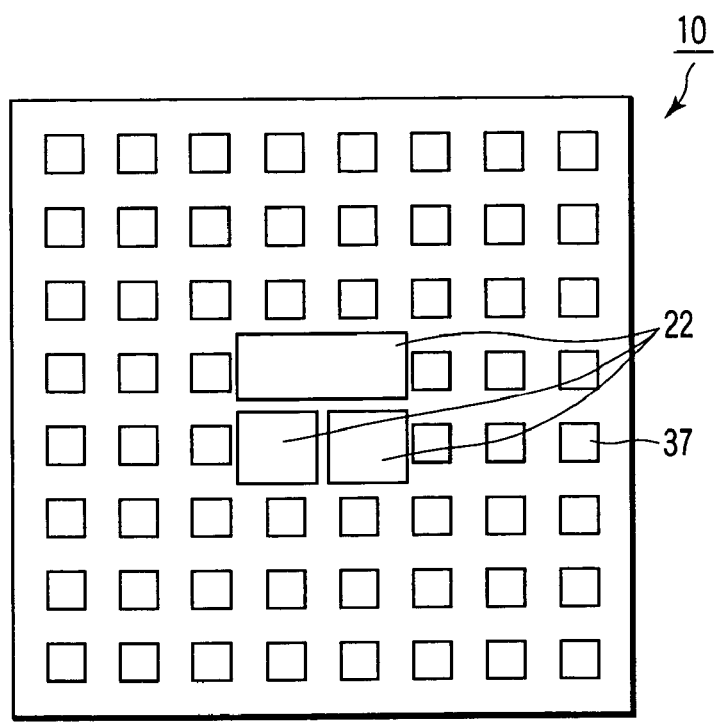
FIG. 11 is a plan view showing another TEG chip according to the first and second embodiments of the present invention.
Figure 12:
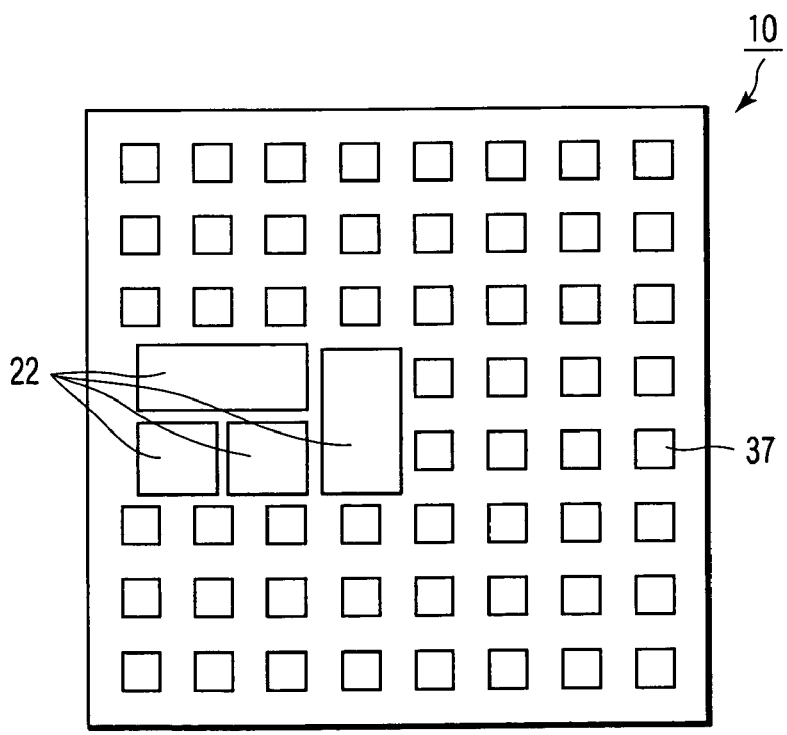
FIG. 12 is a plan view showing still another TEG chip according to the first and second embodiments of the present invention.
Figure 13:
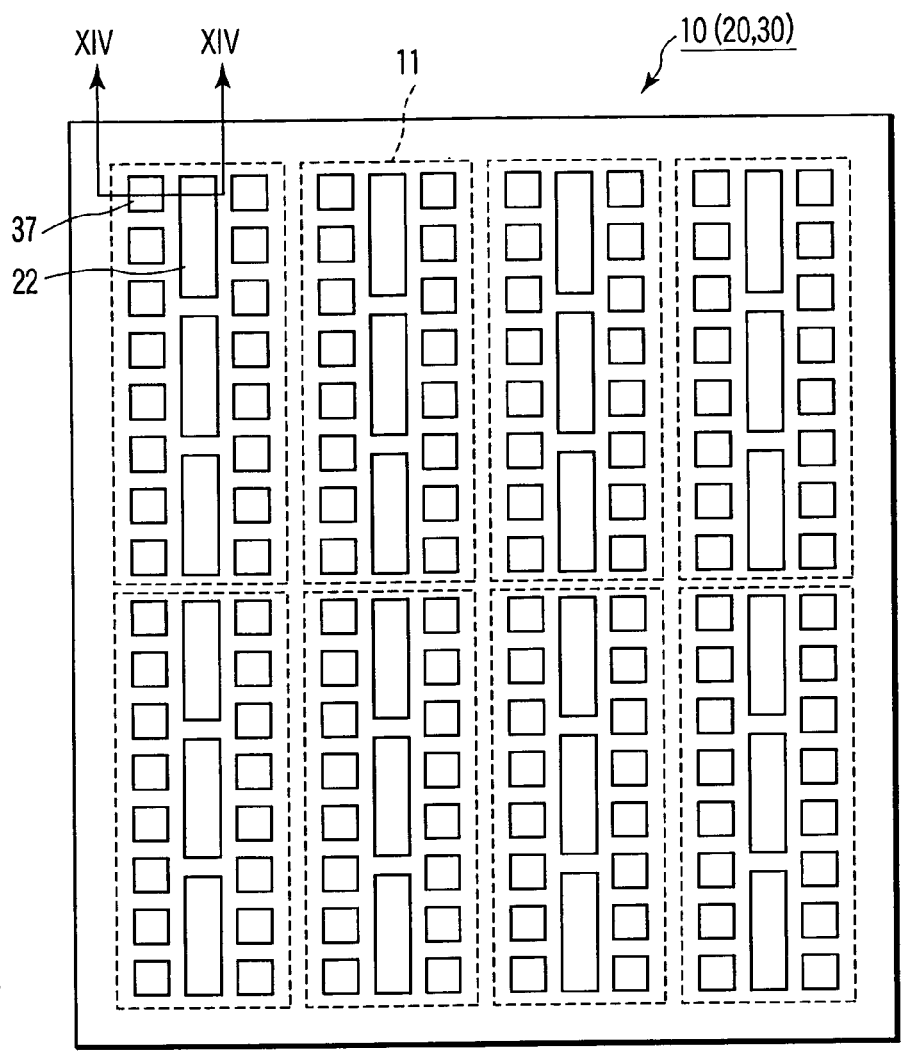
FIG. 13 is a plan view showing a conventional TEG chip.
Figure 14:
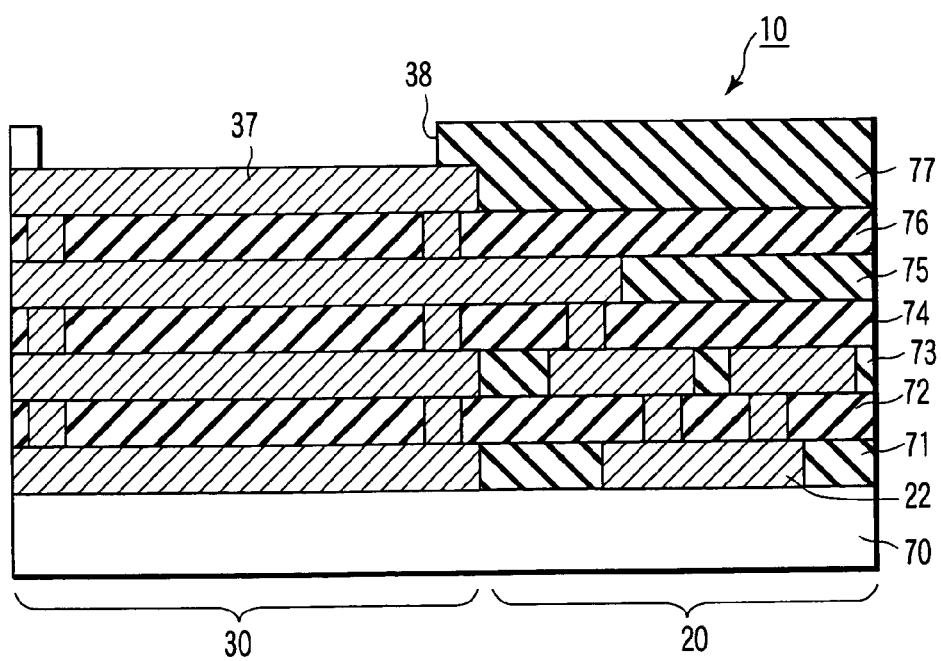
FIG. 14 is a sectional view showing the TEG chip taken along the line XIV—XIV in FIG. 13.

The layout of the test element and pad is not limited to the above-described one, and may be the following one. For example, as shown in FIG. 11, the test elements 22 may be surrounded by the pads 37. Alternatively, as shown in FIG. 12, the test elements 22 may be surrounded by the pads 37 in a U shape.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a first layer;
a plurality of first test semiconductor chip elements which are arranged in the first layer;
a second layer which is different from the first layer and which has a first surface and a second surface opposed to the first surface, the first surface of the second layer being adhered to the first layer;
an opening portion which is arranged on the second surface of the second layer;
a plurality of probe pads which are arranged in the second layer and are electrically connected to the first test semiconductor chip elements through corresponding connecting members, a part of the probe pads being exposed from the opening portion; and a plurality of second test semiconductor chip elements which are arranged in the first layer and electrically insulated from the probe pads, wherein the second test semiconductor chip elements are of a type different from the first test semiconductor chip elements, and the corresponding connecting members do not exist in the second layer.

2. A semiconductor device comprising:

a first layer;

a plurality of first test semiconductor chip elements which are arranged in the first layer;

a second layer which is different from the first layer and which has a first surface and a second surface opposed to the first surface, the first surface of the second layer being adhered to the first layer;

an opening portion which is arranged on the second surface of the second layer;

a plurality of probe pads which are arranged in the second layer and are electrically connected to the first test semiconductor chip elements through corresponding connecting members, a part of the probe pads being exposed from the opening portion; and a plurality of second test semiconductor chip elements which are arranged in the first layer and electrically insulated from the probe pads, wherein the first test semiconductor chip elements are arranged in a first line, the second test semiconductor chip elements are arranged in a second line different from the first line, and the corresponding connecting members do not exist in the second layer.

3. A semiconductor device comprising:

a first layer;

a plurality of first test semiconductor chip elements which are arranged in the first layer;

a second layer which is different from the first layer and which has a first surface and a second surface opposed to the first surface, the first surface of the second layer being adhered to the first layer;

an opening portion which is arranged on the second surface of the second layer;

a plurality of probe pads which are arranged in the second layer and are electrically connected to the first test semiconductor chip elements through corresponding connecting members, a part of the probe pads being exposed from the opening portion; and a plurality of second test semiconductor chip elements which are arranged in the first layer and electrically insulated from the probe pads, wherein the second test semiconductor chip elements are arranged in the first layer below the probe pads, and the corresponding connecting members do not exist in the second layer.

4. A semiconductor device comprising:

a first layer;

a plurality of first test semiconductor chip elements which are arranged in the first layer;

a second layer which is different from the first layer and which has a first surface and a second surface opposed to the first surface, the first surface of the second layer being adhered to the first layer;

an opening portion which is arranged on the second surface of the second layer;

a plurality of probe pads which are arranged in the second layer and are electrically connected to the first test semiconductor chip elements, a part of the probe pads being exposed from the opening portion;

a plurality of bumps which are respectively arranged on the part of the probe pads;

a third layer which is adhered to the second layer via the bumps and is different from the first and second layers;

solder balls which are arranged on the third layer and electrically connected to the first test semiconductor chip elements;

a first connection member which is arranged in the first layer and connected to the first test semiconductor chip elements;

a second connection member which is arranged in the second layer and connected to the probe pads and the first connection member;

a third connection member which is arranged in the third layer and connected to the bumps and the solder balls; and a plurality of second test semiconductor chip elements which are arranged in the first layer and electrically insulated from the probe pads.

* * * * *